(12) United States Patent
Allen et al.

(10) Patent No.: US 9,613,171 B1
(45) Date of Patent: Apr. 4, 2017

(54) MULTI-CYCLE SIGNAL IDENTIFICATION FOR STATIC TIMING ANALYSIS

(71) Applicant: International Business Machines Corporation, Armonk, NY (US)

(72) Inventors: Robert J. Allen, Jericho, VT (US); Vasant B. Rao, Fishkill, NY (US); William J. Wright, Colchester, NY (US); Xin Zhao, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/996,400

(22) Filed: Jan. 15, 2016

(51) Int. Cl.
*G06F 9/455* (2006.01)
*G06F 17/50* (2006.01)

(52) U.S. Cl.
CPC .................. *G06F 17/5031* (2013.01)

(58) Field of Classification Search
USPC ........................................................ 716/108
See application file for complete search history.

(56) References Cited

U.S. PATENT DOCUMENTS

| | | | |
|---|---|---|---|
| 5,095,454 A | 3/1992 | Huang | |
| 5,452,239 A | 9/1995 | Dai et al. | |
| 5,634,116 A * | 5/1997 | Singer | G06F 1/12 713/400 |
| 5,650,938 A | 7/1997 | Bootehsaz et al. | |
| 6,237,127 B1 | 5/2001 | Craven et al. | |
| 6,385,759 B1 | 5/2002 | Batarekh | |
| 6,604,227 B1 | 8/2003 | Foltin et al. | |
| 7,580,037 B1 | 8/2009 | Iotov | |
| 8,225,259 B1 * | 7/2012 | Mendel | H03K 19/177 716/116 |
| 8,640,066 B1 | 1/2014 | Gupta et al. | |
| 9,047,425 B2 | 6/2015 | Hollis | |
| 2009/0070619 A1 | 3/2009 | Gotoh | |

OTHER PUBLICATIONS

Cong et al., Architecture and Synthesis for Multi-cycle On-chip Communicatio, Oct. 1-3, 2003, Hardware/Software Codesign and System Synthesis, 2003. First IEEE/ACM/IFIP International Conference on, pp. 77-78.*

Ivanovic et al., Signal Adaptive System for Time-frequency Analysis, Oct. 9, 2008, Electronics Letters (vol. 44, Issue: 21 ), pp. 1279-1280.*

* cited by examiner

*Primary Examiner* — Bryce Aisaka
(74) *Attorney, Agent, or Firm* — Cantor Colburn LLP; Feb R. Cabrasawan

(57) ABSTRACT

Embodiments relate to multi-cycle signal identification for static timing analysis. An aspect includes identifying, in a circuit under test, a multi-cycle signal, the multi-cycle signal having a longer period than a main clock signal of the circuit under test. Another aspect includes mapping a plurality of additional signals of the circuit under test onto the multi-cycle signal, the plurality of additional signals each having a shorter period than the multi-cycle signal. Yet another aspect includes performing static timing analysis of the circuit under test based on the multi-cycle signal.

18 Claims, 6 Drawing Sheets

MULTI-CYCLE SIGNAL IDENTIFICATION FOR STATIC TIMING ANALYSIS

BACKGROUND

The present invention relates generally to electronic circuit testing, and more specifically, to multi-cycle signal identification for static timing analysis.

Static timing analysis is used in circuit design to determine a maximum achievable frequency of a circuit. Static timing analysis is oriented around the concept of a cycle, which is a repetitive pattern in time during which a unit of information is conveyed in the circuit. The length of a cycle is determined based on standard latch-to-latch launch capture patterns in a circuit design. Cycle-based analysis may be extended to support complex circuit topologies and signaling methods used in large high-frequency structures such as memory arrays. Differentiation of signal types drives variations in checking, propagation, and analysis for various types of circuit elements, such as clocks (timing only information), static logic (level-sensitive, sampled values), and domino logic (pulse based logic).

If signals do not obey assumptions of signal classification within the circuit's cycle, then the signals cannot be treated appropriately by static timing analysis. Therefore, for a circuit comprising multi-cycle logic, static timing analysis may not be effectively applied. For example, correct recognition of gating versus merging of signals, handling of domino circuits, or generated clocks may not be possible. A particular class of multi-cycle logic is controlled by the use of local clocks that are logic-generated. The logic-generated clocks retain the synchronous nature of the timing paths, rather than depending on precise delays to ensure correct selection of multiple co-existing edges in cones of logic. The logic-generated clocks are common in high performance environments (such as microprocessor logic) as well as high efficiency environments (such as memory structures where density and power are more important than single-cycle response times).

SUMMARY

Embodiments include a method, system, and computer program product for multi-cycle signal identification for static timing analysis. An aspect includes identifying, in a circuit under test, a multi-cycle signal, the multi-cycle signal having a longer period than a main clock signal of the circuit under test. Another aspect includes mapping a plurality of additional signals of the circuit under test onto the multi-cycle signal, the plurality of additional signals each having a shorter period than the multi-cycle signal. Yet another aspect includes performing static timing analysis of the circuit under test based on the multi-cycle signal.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Embodiments of multi-cycle signal identification for static timing analysis are provided, with exemplary embodiments being discussed below in detail. In order to apply static timing analysis to a circuit, signals that are periodic but that have a longer cycle than a cycle of the main clock of the circuit are identified. An overall longer cycle for the circuit is determined, and other signals in the circuit are mapped onto the longer cycle. Then, static timing analysis is performed based on the longer cycle. Annotation and lightweight logic analysis are iteratively applied to recognize multi-cycle signal constraints, and automatically perform phase-adjustment to map other signals onto the longer cycle so that classification and signal treatment may be performed. Logic at clock gates and latch inputs, in particular, is checked. Primary inputs may be marked and latch input-output cycles can be detected. Clock gates and latch inputs are also checked for compatible forcing logic. Data signals that are cyclic are identified, and used to determine the longer cycle.

Figure 1:
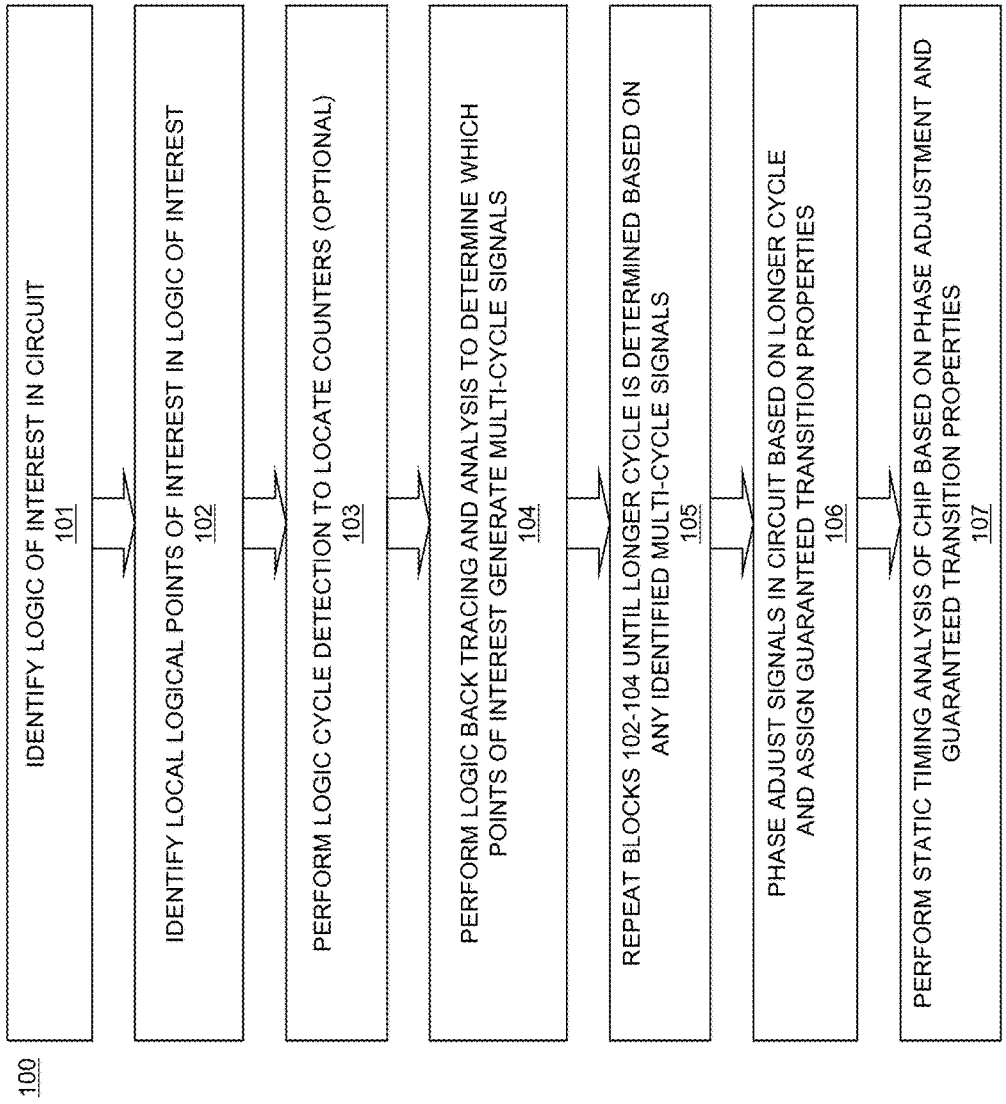
FIG. 1 depicts a process flow for multi-cycle signal identification for static timing analysis accordance with an embodiment.

FIG. 1 illustrates an embodiment of a method 100 for multi-cycle signal identification for static timing analysis. In block 101, circuit data is received for a circuit that is to be tested using static timing analysis, and particular logic of interest is identified in the circuit that is under analysis. Logic of interest may be identified by user-provided input in some embodiments. Logic of interest may include inputs with known cycle-patterns; mode control pins having a direct current (DC) or known state during operation of the circuit; or any other state nodes that might be significant (for example, latches) for iterative or cycle based phase identification. Any control signals that interact with the main clock of the circuit may be identified. In some embodiments, points in the circuit that are known not to be multicycle may be cut from the circuit topology that is being analyzed, in order to speed up back-tracing.

Next, in block 102, logical points of interest are identified within the logic of interest that was identified in block 101. Such logical points of interest may include, but are not limited to, latches and clock gating situations such as local clock buffers (LCBs). In block 103, logic cycle detection may be optionally performed in the circuit to locate any signals that act as counters in the circuit. Then, in block 104, logic back-tracing and analysis is performed to determine particular points of interest that generate multi-cycle signals. The multi-cycle signals may be data signals that are observed to change state in a periodic manner. The requirements and constant-value assumptions used in the back-tracing analysis may vary by operational mode. In particular, gates and input data that are forced by cycle-patterned values are determined. Clock-tracing may be used to eliminate uninteresting points from consideration.

In block 105, blocks 102-104 are repeated until the identification of the points of interest is settled and the overall longer cycle of the circuit is determined based on any identified multi-cycle signals. In block 106, phase adjustment of the circuit is performed, and guaranteed transition (GT) designations are assigned to points in the circuit, based on the determinations of block 104. Phases are renamed and arrival times are shifted to their correct location in the overall longer cycle. Lastly, in block 107, static timing analysis is performed using the overall longer cycle.

Figure 2:
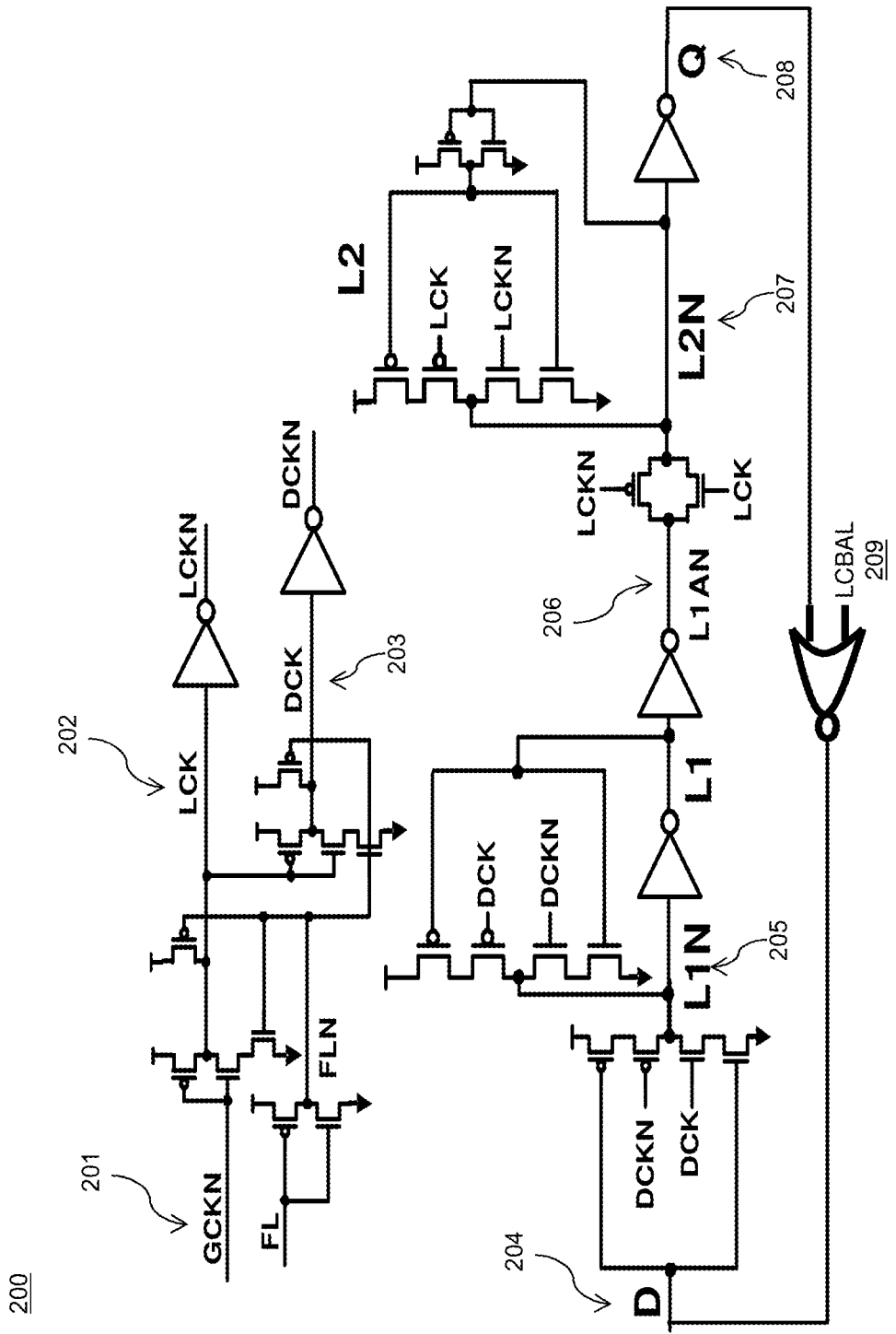
FIG. 2 depicts an example of a circuit for multi-cycle signal identification for static timing analysis in accordance with an embodiment.
Figure 3:
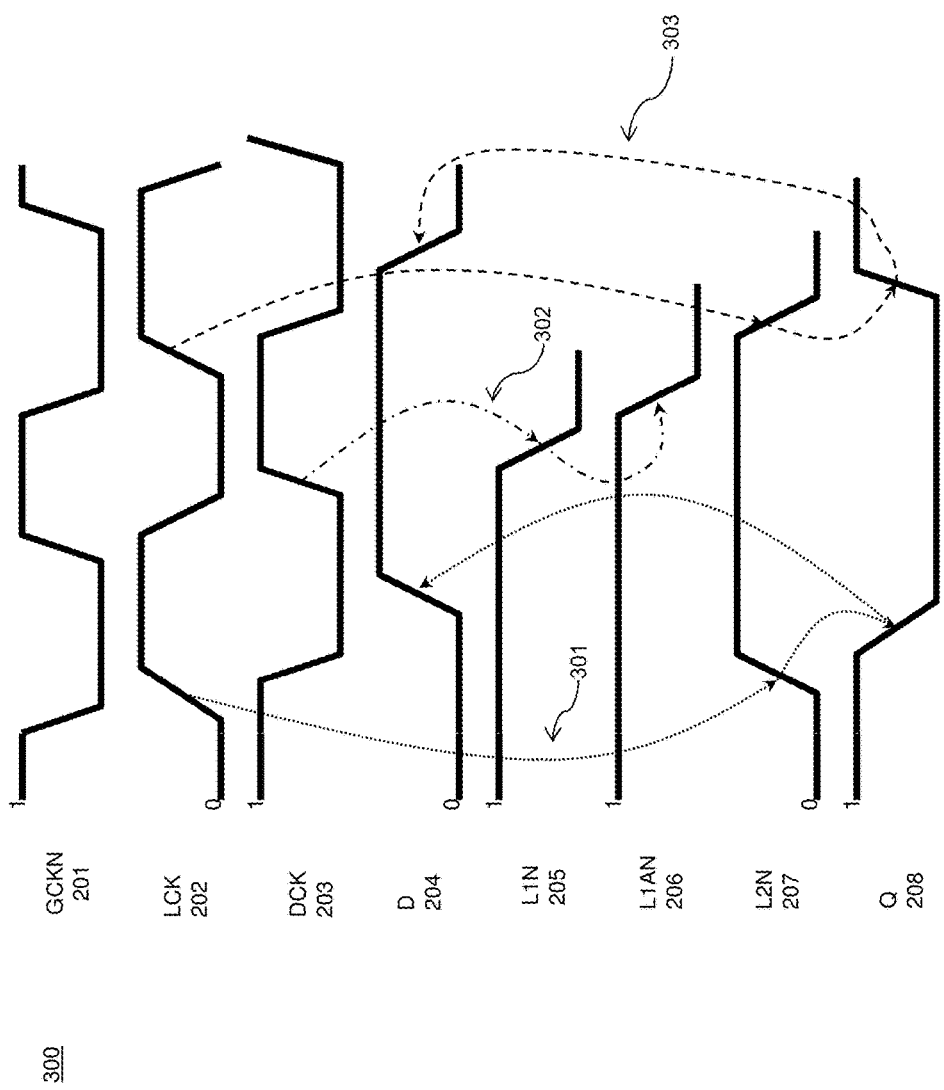
FIG. 3 depicts an example of signals for multi-cycle signal identification for static timing analysis corresponding to the circuit of FIG. 2.

FIG. 2 depicts an example of a circuit 200 for multi-cycle signal identification for static timing analysis in accordance with an embodiment, and FIG. 3 depicts an example of signals 300 for multi-cycle signal identification for static timing analysis corresponding to the circuit 200 of FIG. 2. In circuit 200, general clock signal (GCKN) 201 is used to generate two shifted clocks LCK 202 and DCK 203 (in addition to respective inverse clock signals LCKN and DCKN). Clocks DCK 203 and LCK 202 control generation of a master latch signal L1 (which is the inverse of signal L1N 205) and a slave latch signal L2N 207, respectively. Circuit 200 receives an input signal D 204, and outputs an output signal Q 208. The master latch in circuit 200 samples signal D 204 when DCK 203 is high, and transfers its contents to the slave latch when LCK 202 is high. As shown in FIG. 3, signal D 204 and signal Q 208 have twice the period of GCKN 201. Logic analysis of signal D 204 shows that, given marked control signals (i.e., when LCBAL 209 is 0 during functional operation of circuit 200), signal D 204 is fully determined by itself from a previous cycle, and thus acts as a counter. Therefore, the signal Q 208 is marked as divider. Relationships between the various signals 300 of circuit 200 are shown by arrows 301-303 of FIG. 3. As shown in FIG. 3, a rise on signal LCK 202 causes L2N 207 to rise, resulting in falling of signal Q 208, which causes signal D 204 to rise, as illustrated by arrow 301. Then, signal DCK 203 rising causes signal L1N 205 to fall, which also causes L1AN 206 to fall, as illustrated by arrow 302. Finally, the next rise on signal LCK 202 causes L2N 207 to fall, resulting in rising of signal Q 208, which causes signal D 204 to fall, as illustrated by arrow 303. Signal Q 208 may be used at a downstream gate, or LCB (not shown), as a clock, with the resulting clock output from the downstream LCB being phase-shifted to double-period. For static timing analysis of circuit 200, the longer cycle of circuit 200 may be considered to be the cycle of signals D 204 and Q 208, rather than the shorter cycle of any of the clock signals 201, 202, or 203, and all other signals in the circuit may be mapped onto the longer cycle of signals D 204 and Q 208.

Figure 4:
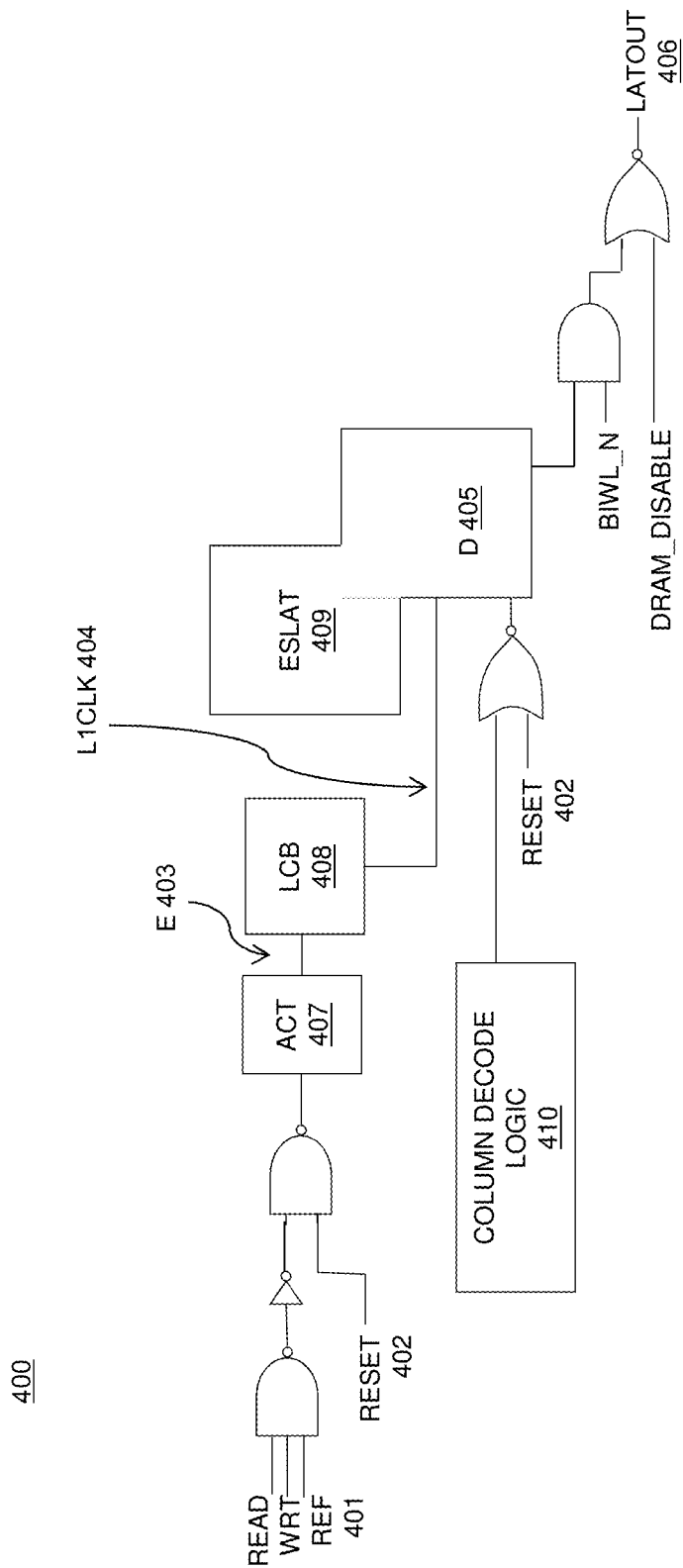
FIG. 4 depicts an example of a circuit for multi-cycle signal identification for static timing analysis in accordance with an embodiment.
Figure 5:
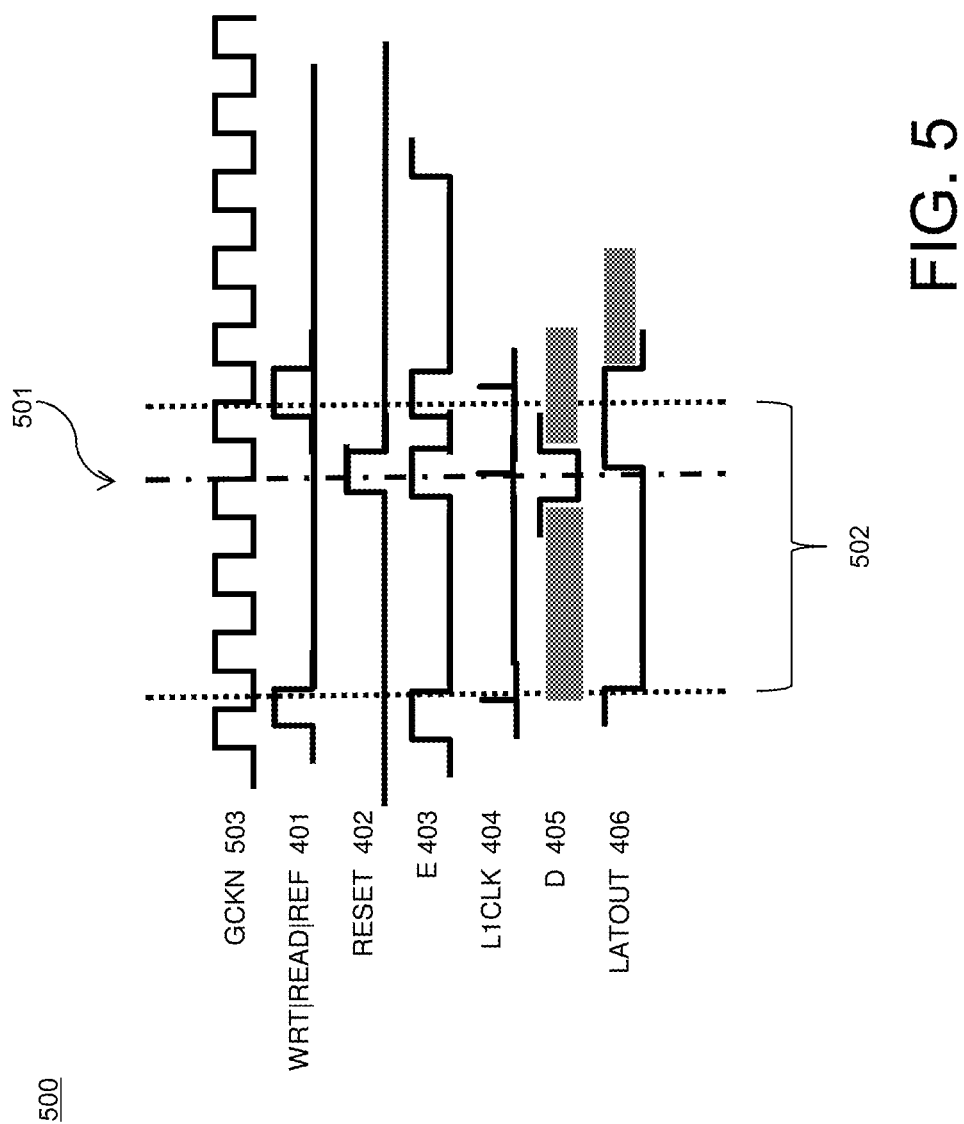
FIG. 5 depicts an example of signals for multi-cycle signal identification for static timing analysis corresponding to the circuit of FIG. 4.

FIG. 4 depicts another example of a circuit 400 for multi-cycle signal identification for static timing analysis in accordance with an embodiment, and FIG. 5 depicts an example of signals 500 for multi-cycle signal identification for static timing analysis corresponding to the circuit 400 of FIG. 4. In circuit 400 of FIG. 4, commands on write/read/reference signal input 401 are separated by at least P cycles of a general clock signal (GCKN) 503 that is shown in FIG. 5. The reset signal 402 is guaranteed exactly and only X cycles (where X<P) after a command. LCB 408 is enabled by enable signal E 403 from ACT 407. Signal E 403 enables LCB 408 when a command is received on write/read/reference signal input 401, or when a reset 402 occurs. The output of LCB 408, i.e., L1CLK 404, is received by latch ESLAT 409, which stores data D that is sampled from the output of column decode logic 410 based on reset 402. L1CLK 404 ensures that data D 405 only changes at a clock signal boundary. Data D 405 will be zero when reset 402 fires. The sampling of the output of column decode logic 410 based on the reset 402 ensures that LATOUT 406 will be one in cycle X after a command on write/read/reference signal input 401, and will stay that way for P-X cycles of GCKN 503. As illustrated by line 501 in signals 500 of FIG. 5, when reset signal 402 fires in cycle X, signal E 403 and L1CLK 404 go high, data D 405 goes to zero, and LATOUT 406 goes high and will stay high for P-X cycles. LATOUT 406 is therefore a guaranteed transition (GT) signal for static timing analysis purposes. The longer cycle of circuit 400 is given by cycle 502 of FIG. 5, which is 4 cycles of GCKN 503.

Figure 6:
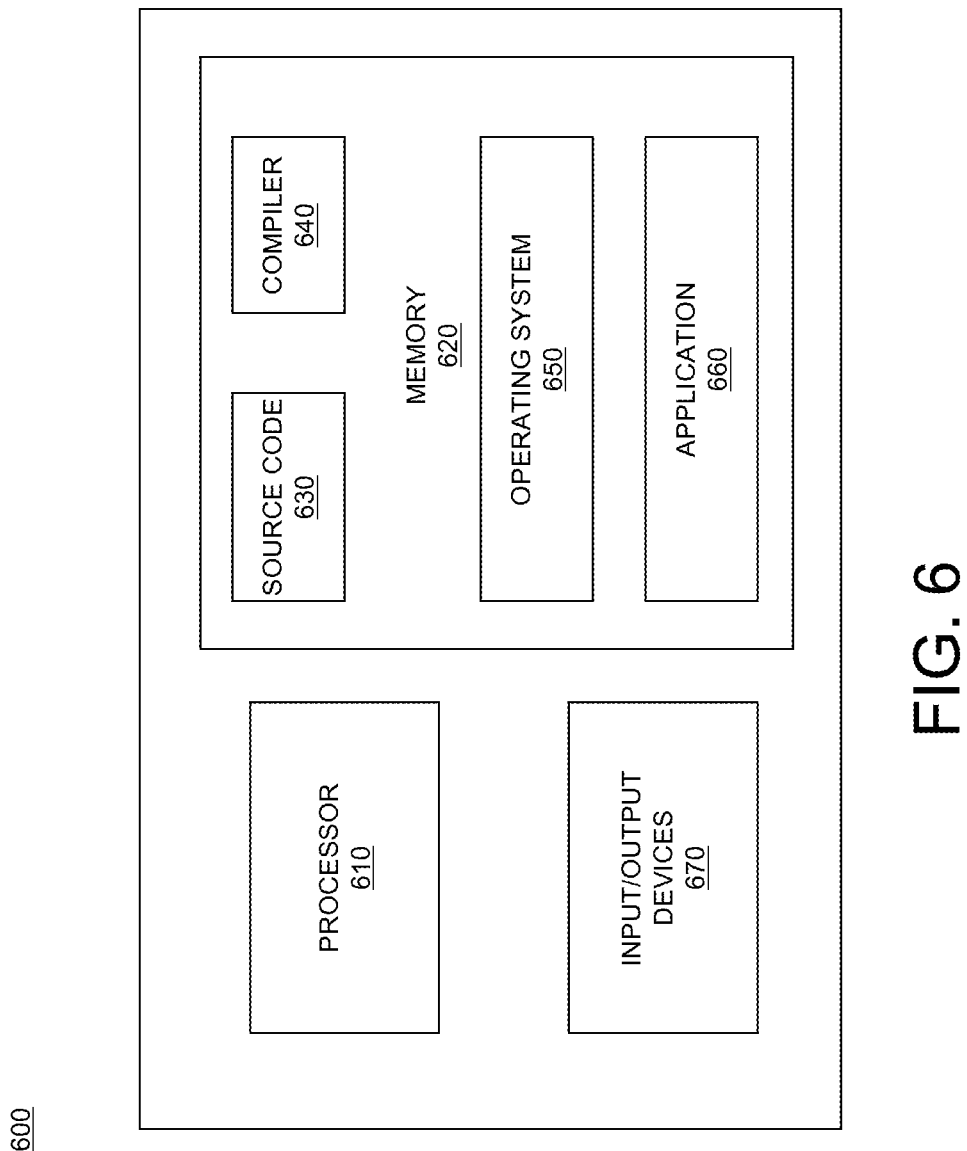
FIG. 6 depicts an example of a computer for use in conjunction with embodiments of multi-cycle signal identification for static timing analysis.

FIG. 6 illustrates an example of a computer 600 which may be utilized by exemplary embodiments of multi-cycle signal identification for static timing analysis. Various operations discussed above may utilize the capabilities of the computer 600. One or more of the capabilities of the computer 600 may be incorporated in any element, module, application, and/or component discussed herein.

The computer 600 includes, but is not limited to, PCs, workstations, laptops, PDAs, palm devices, servers, storages, and the like. Generally, in terms of hardware architecture, the computer 600 may include one or more processors 610, memory 620, and one or more I/O devices 670 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 610 is a hardware device for executing software that can be stored in the memory 620. The processor 610 can be virtually any custom made or commercially available processor, a central processing unit (CPU), a digital signal processor (DSP), or an auxiliary processor among several processors associated with the computer 600, and the processor 610 may be a semiconductor based microprocessor (in the form of a microchip) or a macroprocessor.

The memory 620 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 620 may incorporate electronic, magnetic, optical, and/or other types of storage media. Note that the memory 620 can have a distributed architecture, where various components are situated remote from one another, but can be accessed by the processor 610.

The software in the memory 620 may include one or more separate programs, each of which comprises an ordered listing of executable instructions for implementing logical functions. The software in the memory 620 includes a suitable operating system (O/S) 650, compiler 640, source code 630, and one or more applications 660 in accordance with exemplary embodiments. As illustrated, the application 660 comprises numerous functional components for implementing the features and operations of the exemplary embodiments. The application 660 of the computer 600 may represent various applications, computational units, logic, functional units, processes, operations, virtual entities, and/or modules in accordance with exemplary embodiments, but the application 660 is not meant to be a limitation.

The operating system 650 controls the execution of other computer programs, and provides scheduling, input-output control, file and data management, memory management, and communication control and related services. It is contemplated by the inventors that the application 660 for implementing exemplary embodiments may be applicable on all commercially available operating systems.

Application 660 may be a source program, executable program (object code), script, or any other entity comprising a set of instructions to be performed. When a source program, then the program is usually translated via a compiler (such as the compiler 640), assembler, interpreter, or the like, which may or may not be included within the memory 620, so as to operate properly in connection with the O/S 650. Furthermore, the application 660 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 670 may include input devices such as, for example but not limited to, a mouse, keyboard, scanner, microphone, camera, etc. Furthermore, the I/O devices 670 may also include output devices, for example but not limited to a printer, display, etc. Finally, the I/O devices 670 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 670 also include components for communicating over various networks, such as the Internet or intranet.

If the computer 600 is a PC, workstation, intelligent device or the like, the software in the memory 620 may further include a basic input output system (BIOS) (omitted for simplicity). The BIOS is a set of essential software routines that initialize and test hardware at startup, start the O/S 650, and support the transfer of data among the hardware devices. The BIOS is stored in some type of read-only-memory, such as ROM, PROM, EPROM, EEPROM or the like, so that the BIOS can be executed when the computer 600 is activated.

When the computer 600 is in operation, the processor 610 is configured to execute software stored within the memory 620, to communicate data to and from the memory 620, and to generally control operations of the computer 600 pursuant to the software. The application 660 and the O/S 650 are read, in whole or in part, by the processor 610, perhaps buffered within the processor 610, and then executed.

When the application 660 is implemented in software it should be noted that the application 660 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 660 can be embodied in any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any means that can store the program for use by or in connection with the instruction execution system, apparatus, or device. The computer readable storage medium can be, for example but not limited to, an electronic, magnetic, optical, electromagnetic, or semiconductor system, apparatus, or a device.

More specific examples (a nonexhaustive list) of the computer-readable storage medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable storage medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 660 is implemented in hardware, the application 660 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects and benefits include application of static timing analysis to multi-cycle circuits.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for multi-cycle signal identification for static timing analysis, the method comprising:
    identifying, in a circuit under test, a multi-cycle signal, the multi-cycle signal having a longer period than a main clock signal of the circuit under test;
    performing a phase adjustment of a plurality of additional signals of the circuit under test to map the plurality of additional signals onto the multi-cycle signal, the plurality of additional signals each having a shorter period than the multi-cycle signal; and
    determining a maximum frequency of the circuit under test by performing static timing analysis of the circuit under test based on the multi-cycle signal having the plurality of additional signals mapped thereon.

2. The method of claim 1, wherein the multi-cycle signal comprises a data signal in the circuit under test.

3. The method of claim 1, wherein the multi-cycle signal comprises a latch output.

4. The method of claim 1, wherein identifying the multi-cycle signal comprises determining that the multi-cycle signal acts as a counter.

5. The method of claim 1, wherein the multi-cycle signal comprises a signal at a mode control pin.

6. The method of claim 1, wherein the multi-cycle signal comprises a signal at a local clock buffer.

7. A computer program product for implementing multi-cycle signal identification for static timing analysis, the computer program product comprising:
  a computer readable storage medium having program instructions embodied therewith, the program instructions readable by a processing circuit to cause the processing circuit to perform a method comprising:
  identifying, in a circuit under test, a multi-cycle signal, the multi-cycle signal having a longer period than a main clock signal of the circuit under test;
  performing a phase adjustment of a plurality of additional signals of the circuit under test to map the plurality of additional signals onto the multi-cycle signal, the plurality of additional signals each having a shorter period than the multi-cycle signal; and
  determining a maximum frequency of the circuit under test by performing static timing analysis of the circuit under test based on the multi-cycle signal having the plurality of additional signals mapped thereon.

8. The computer program product of claim 7, wherein the multi-cycle signal comprises a data signal in the circuit under test.

9. The computer program product of claim 7, wherein the multi-cycle signal comprises a latch output.

10. The computer program product of claim 7, wherein identifying the multi-cycle signal comprises determining that the multi-cycle signal acts as a counter.

11. The computer program product of claim 7, wherein the multi-cycle signal comprises a signal at a mode control pin.

12. The computer program product of claim 7, wherein the multi-cycle signal comprises a signal at a local clock buffer.

13. A computer system for multi-cycle signal identification for static timing analysis, the system comprising:
  a memory; and
  a processor, communicatively coupled to said memory, the computer system configured to perform a method comprising:
  identifying, in a circuit under test, a multi-cycle signal, the multi-cycle signal having a longer period than a main clock signal of the circuit under test;
  performing a phase adjustment of a plurality of additional signals of the circuit under test to map the plurality of additional signals onto the multi-cycle signal, the plurality of additional signals each having a shorter period than the multi-cycle signal; and
  determining a maximum frequency of the circuit under test by performing static timing analysis of the circuit under test based on the multi-cycle signal having the plurality of additional signals mapped thereon.

14. The computer system of claim 13, wherein the multi-cycle signal comprises a data signal in the circuit under test.

15. The computer system of claim 13, wherein the multi-cycle signal comprises a latch output.

16. The computer system of claim 13, wherein identifying the multi-cycle signal comprises determining that the multi-cycle signal acts as a counter.

17. The computer system of claim 13, wherein the multi-cycle signal comprises a signal at a mode control pin.

18. The computer system of claim 13, wherein the multi-cycle signal comprises a signal at a local clock buffer.

* * * * *